United States Patent [19]

Irving et al.

[11] Patent Number: 5,080,998
[45] Date of Patent: Jan. 14, 1992

[54] PROCESS FOR THE FORMATION OF POSITIVE IMAGES UTILIZING ELECTRODEPOSITION OF O-QUINONE DIAZIDE COMPOUND CONTAINING PHOTORESIST ON CONDUCTIVE SURFACE

[75] Inventors: Edward Irving, Burwell; Christopher G. Demmer, Ickleton; Jane Wilkerson, Cambridge, all of England

[73] Assignee: Ciba-Geigy Corporation, Ardsley, N.Y.

[21] Appl. No.: 629,099

[22] Filed: Dec. 17, 1990

Related U.S. Application Data

[63] Continuation of Ser. No. 554,938, Jul. 12, 1990, abandoned, which is a continuation of Ser. No. 403,846, Sep. 1, 1989, abandoned, which is a continuation of Ser. No. 108,345, Oct. 14, 1987, abandoned.

[30] Foreign Application Priority Data

Oct. 23, 1986 [GB] United Kingdom ............... 8625383
Feb. 20, 1987 [GB] United Kingdom ............... 8704061

[51] Int. Cl.⁵ .......................... G03C 1/74; G03F 7/32
[52] U.S. Cl. ................................... 430/169; 430/168; 430/190; 430/192; 430/193; 430/326; 204/181.6; 204/181.7
[58] Field of Search ............ 430/168, 169, 190, 192, 430/193, 326; 204/181.6, 181.7

[56] References Cited

U.S. PATENT DOCUMENTS

| | | | |
|---|---|---|---|
| 3,551,154 | 12/1970 | DiBlas et al. | 430/192 |
| 3,890,153 | 6/1975 | Dijkstra et al. | 430/192 |
| 3,954,587 | 5/1976 | Kokawa | 204/159.12 |
| 4,122,053 | 10/1978 | Murphy et al. | 204/181.6 |
| 4,159,364 | 6/1979 | Craig | 204/181.6 |
| 4,268,602 | 5/1981 | Yoshino et al. | 430/192 |
| 4,362,853 | 12/1982 | Demmer | 528/137 |
| 4,384,037 | 5/1983 | Hosaka et al. | 430/192 |
| 4,411,978 | 10/1983 | Laridon et al. | 430/192 |
| 4,414,311 | 11/1983 | Walls et al. | 430/157 |
| 4,467,027 | 8/1984 | Yamamoto et al. | 430/192 |
| 4,529,682 | 7/1985 | Toukhy | 430/192 |
| 4,536,465 | 8/1985 | Uehara et al. | 430/192 |
| 4,632,891 | 12/1986 | Banks et al. | 430/190 |
| 4,632,900 | 12/1986 | Demmer et al. | 430/323 |
| 4,681,923 | 7/1987 | Demmer et al. | 430/323 |
| 4,699,867 | 10/1987 | Schneller et al. | 430/192 |

FOREIGN PATENT DOCUMENTS 176356  4/1986  European Pat. Off. ............ 430/323

OTHER PUBLICATIONS

Derwent Abstract of European Pat. No. 184,553, Published 6/1986.
Japanese Abstract 6, 255 (P-162) (1133) (1982).

*Primary Examiner*—Charles L. Bowers, Jr.
*Assistant Examiner*—Christopher G. Young
*Attorney, Agent, or Firm*—Luther A. R. Hall

[57] ABSTRACT

A process for the formation of an image comprises
(i) electrodepositing on a conductive surface a photosensitive film from an aqueous composition which is a solution or dispersion comprising a mixture of (A) a photosensitive o-quinone diazide such as an o-naphthoquinone diazide sulfonyl ester of a phenol, and (B) an electrodepositable film-forming resin such as a reaction product of a novolak resin, formaldehyde and diethanolamine in (C) an aqueous medium, the composition being substantially free from a resin having both a quinone diazide residue and a carboxyl, phosphonic or sulfonic acid group or amino group in the same molecule,
(ii) subjecting the electrodeposited film to radiation in a predetermined pattern, such that exposed areas of the film become more soluble in aqueous base than unexposed areas, and
(iii) removing the exposed areas by treatment with an aqueous base.

The process is useful in the production of printing plates and printed circuits.

13 Claims, No Drawings

PROCESS FOR THE FORMATION OF POSITIVE IMAGES UTILIZING ELECTRODEPOSITION OF O-QUINONE DIAZIDE COMPOUND CONTAINING PHOTORESIST ON CONDUCTIVE SURFACE

This is a continuation of application Ser. No. 554,938, filed July 12, 1990, now abandoned, which is a continuation of application Ser. No. 403,846, filed Sept. 1, 1989, now abandoned, which is a continuation of application Ser. No. 108,345, filed Oct. 14, 1987, now abandoned.

This invention relates to a method of forming images which is useful in the production of printing plates and printed circuits.

In European Patent Publications Nos. 0 155 231, 0 184 553 and 0 196 999 the electrodeposition of resinous quinone diazide-containing positive photoresists is described. These photoresists are phenolic resins modified by introducing into the resin molecule a carboxyl, phosphonic or sulphonic acid group or amino group and by reacting phenolic hydroxyl groups on the resin with an esterifying derivative of a quinone diazide sulphonic acid. Although these photoresists give good films on electrodeposition and good images on imagewise irradiation, their preparation is difficult and time-consuming. The reactions involved in the synthesis of the modified phenolic resins, which required elevated temperatures, have to be carefully controlled to avoid decomposition of the quinone diazide residue, otherwise the degree of photosensitivity of the electrodeposited film will be lower than expected. Furthermore, it is not possible to modify the photosensitivity or electrodepositability of the modified phenolic resins without repeating the synthetic reaction sequence.

It has now been found, surprisingly, that good photosensitive films can be electrodeposited from an aqueous composition containing a mixture of an electrodepositable resin and a compound having a quinone diazide residue without the need to prepare a resin having both a quinone diazide residue and a carboxyl, phosphonic or sulphonic acid group or amino group in the molecule. The electrodepositable resin and the quinone diazide compound can be materials which are readily available commercially. The use of such a mixture permits considerable latitude in formulation. The degree of photosensitivity of the electrodeposited film can be readily varied to meet a particular requirement simply by adjusting the ratio of the amounts of the components of the mixture.

Accordingly, the present invention provides a process for the formation of an image which comprises (i) electrodepositing on a conductive surface a photosensitive film from an aqueous composition which is a solution or dispersion comprising a mixture of (A) a photosensitive o-quinone diazide compound and (B) an electrodepositable film-forming resin in (C) an aqueous medium, said composition being substantially free from a resin having both a quinone diazide residue and a carboxyl, phosphonic or sulphonic acid group or amino group in the same molecule, (ii) subjecting the electrodeposited film to radiation in a predetermined pattern, such that exposed areas of the film become more soluble in aqueous base than unexposed areas, and (iii) removing the exposed areas by treatment with an aqueous base.

The present invention also provides an aqueous composition suitable for use in the image-forming process of the invention which is a solution or dispersion comprising a mixture of (A) a photosensitive o-quinone diazide compound and (B) an electrodepositable film-forming resin in (C) an aqueous medium, said composition being substantially free from a resin having both a quinone diazide residue and a carboxyl, phosphonic or sulphonic acid or amino group in the same molecule.

Photosensitive o-quinone diazide compounds are well known. Examples include o-benzoquinone diazide sulphonyl or o-naphthoquinone diazide sulphonyl esters or amides of compounds, particularly aromatic compounds, having a hydroxy group or amino group respectively. Preferred o-quinone diazides are o-benzoquinone diazide sulphonyl and o-naphthoquinone diazide sulphonyl esters of phenols, including monohydric phenols and, particularly, polyhydric phenols such as 2,2-bis(hydroxyphenyl)propanes, dihydroxydiphenyls, di- and tri-hydroxy-substituted benzophenones, and phenolic resins, including phenol-aldehyde resins and polymers of phenols having polymerisable unsaturated substituents. Suitable phenol-aldehyde resins from which the esters may be derived include novolak resins prepared from phenol itself, an alkyl-substituted phenol such as o-, m- or p-cresol, o-, m- or p-tert.butylphenol, o-, m- or p-octylphenol, or a bisphenol such as 2,2-bis(4-hydroxyphenyl)propane, or a mixture of two or more of such phenols, and an aldehyde such as acetaldehyde, benzaldehyde, glyoxylic acid or, preferably, formaldehyde. Suitable polymers of unsaturated phenols from which the esters may be derived include homopolymers and copolymers of p-vinyl phenol and p-isopropenyl phenol.

Preferred o-quinone diazide sulphonyl esters of phenols are o-naphthoquinone diazide sulphonyl esters of polyhydroxybenzophenones or novolak resins derived from formaldehyde and an alkyl-substituted phenol or a mixture thereof with phenol. Particularly preferred esters are 1,2-naphthoquinone-2-diazide-5-sulphonyl esters of dihydroxybenzophenones, trihydroxybenzophenones, novolaks derived from formaldehyde and either a mixture of o-, m- and p-cresols or a mixture of phenol and p-tert.butylphenol.

The photosensitive quinone diazides hereinbefore described are either commercially available or may be prepared by conventional methods, for example by reacting a phenol with an esterifying derivative of an o-quinone diazide sulphonic acid, usually the sulphonyl chloride thereof, under conventional conditions.

Electrodepositable film-forming resins are also well known. They may be cationic resins containing basic groups such as amino groups, anionic resins containing acidic groups such as carboxylic, sulphonic or phosphonic acid groups, or resins having both basic and acidic groups.

In order for the electrodepositable resin to be electrodepositable, it is present in the aqueous composition in at least partially ionised form. For cationic resins this is usually achieved by at least partial neutralisation of the basic groups with an acid. For anionic resins, this is usually achieved by at least partial neutralisation with a base. For resins containing both basic and acidic groups, at least partial neutralisation can be accomplished with an acid or a base.

Examples of cationic electrodepositable resins are reaction products of an epoxide resin with a primary or secondary monoamine or a secondary diamine, particularly a reaction product of an epoxy resin, such as a diglycidyl ether of 2,2-bis(4-hydroxyphenyl)propane (bisphenol A), with an alkanolamine such as ethanolamine, diethanolamine or propanolamine; reaction products of a phenolic hydroxyl group-containing resin, such as a novolak resin, a polymer of an ethylenically unsaturated phenol or a phenolic hydroxyl-terminated adduct of an epoxide resin and a bisphenol, with an aldehyde and a primary or secondary amine, for example reaction products of a novolak resin or a poly(-vinyl)phenol with an aldehyde such as acetaldehyde, benzaldehyde or, preferably, formaldehyde, and an amine such as a dialkylamine, an alkylenediamine or an alkanolamine; polymers of basic group-containing acrylic materials such as homopolymers of dialkylaminoalkyl acrylates or methacrylates and copolymers thereof, including copolymers with other vinyl monomers, such as alkyl acrylates or methacrylates, and graft copolymers with acrylate or methacrylate group-containing resins such as esters of epoxide resins with acrylic or methacrylic acid; and Michael addition reaction products of acrylate or methacrylate group-containing resins with a primary or secondary amine such as ethanolamine, diethanolamine or morpholine.

Examples of anionic electrodepositable resins are carboxyl-terminated diene polymers such as carboxyl-terminated homopolymers and copolymers of butadiene; polymers of ethylenically unsaturated carboxylic, sulphonic or phosphonic acids, particularly homopolymers and copolymers of acrylic or methacrylic acid; carboxyl-terminated polyesters; reaction products of hydroxyl group-containing resins, such as hydroxyl-terminated polyesters, polymers of hydroxyl-containing vinyl monomers, or hydroxyl group-containing epoxide resins, with polycarboxylic acid anhydrides; and carboxyl group-containing reaction products of epoxide resins with mercaptocarboxylic acids.

Examples of electrodepositable resins containing both cationic and anionic groups are reaction products of epoxide resins with an aminocarboxylic acid, an aminosulphonic acid or an aminophosphonic acid; reaction products of a phenolic hydroxyl group-containing resin, such as a novolak resin, a polymer of an ethylenically unsaturated phenol or a phenolic hydroxyl-terminated adduct of an epoxide resin and a bisphenol, with an aldehyde, such as acetaldehyde, benzaldehyde or, preferably, formaldehyde, and an aminocarboxylic, aminosulphonic or aminophosphonic acid; copolymers of an ethylenically unsaturated acid, such as acrylic or methacrylic acid, with an ethylenically unsaturated amine such as a dialkylaminoalkyl acrylate or methacrylate, and optionally one or more further ethylenically unsaturated monomers; and graft copolymers of such an unsaturated acid and unsaturated amine with acrylate or methacrylate group-containing resins such as esters of epoxide resins with acrylic or methacrylic acid.

Preferred electrodepositable resins are those containing amino, carboxylic or sulphonic acid groups, present in the aqueous composition in at least partially ionised form. Further preferred are cationic or cationic/anionic phenolic resins which are reaction products of a novolak resin, an aldehyde and a primary or secondary amine or an aminocarboxylic acid; cationic copolymers of a dialkylaminoalkyl acrylate or methacrylate with an alkyl or hydroxyalkyl acrylate or methacrylate and, optionally, one or more other vinyl monomers; anionic copolymers of acrylic acid or methacrylic acid with an alkyl or hydroxyalkyl acrylate or methacrylate and, optionally, one or more other vinyl monomers; anionic copolymers of a vinyl group-containing sulphonic acid with an acrylate or methacrylate ester and, optionally, one or more other vinyl monomers; and cationic/anionic copolymers of a dialkylaminoalkyl acrylate or methacrylate, acrylic acid or methacrylic acid, an alkyl or hydroxyalkyl acrylate or methacrylate and, optionally, one or more other vinyl monomers.

Preferred cationic and cationic/anionic phenolic resins are reaction products of (a) a novolak resin derived from phenol, or an alkyl-substituted phenol such as o-, m- or p-cresol, o-, m- or p-tert.butylphenol, o-, m- or p-octylphenol, or a mixture of two or more such phenols, and formaldehyde, acetaldehyde or benzaldehyde, (b) formaldehyde, acetaldehyde or benzaldehyde and (c) an alkanolamine, such as ethanolamine, diethanolamine, propanolamine or butanolamine, or an aminocarboxylic acid such as sarcosine, glycine, aspartic acid, glutamic acid, iminodiacetic acid, anthranilic acid or p-aminobenzoic acid. Particularly preferred amongst these resins are those where (a) is a novolak resin derived from formaldehyde and either a mixture of o-, m- and p-cresols or a mixture of phenol and p-tert.butylphenol, (b) is formaldehyde and (c) is diethanolamine, sarcosine or glycine. The cationic and cationic/anionic phenolic resins can be prepared by subjecting the reactants to conventional Mannich reaction conditions.

Preferred cationic copolymers are copolymers of dimethylaminoethyl acrylate or methacrylate with a $C_1$ to $C_{12}$ alkyl or hydroxyalkyl acrylate or methacrylate and, optionally, one or more other vinyl monomers. Particularly preferred amongst such copolymers are those of dimethylaminoethyl methacrylate with 2-ethylhexyl acrylate, 2-hydroxyethyl methacrylate and styrene.

Anionic copolymers which are preferred are copolymers of acrylic acid or methacrylic acid with a $C_1$ to $C_{12}$ alkyl or hydroxyalkyl acrylate or methacrylate and, optionally, one or more other vinyl monomers. Particularly preferred amongst these copolymers are those of methacrylic acid with methyl methacrylate and 2-hydroxyethyl methacrylate and those of methacrylic acid with methyl methacrylate, 2-ethylhexyl methacrylate and 2-hydroxyethyl methacrylate.

Other preferred anionic copolymers are copolymers of an acrylamide containing a sulphonic acid group with a 3-acryloyloxy-2-hydroxypropyl or 3-methacryloyloxy-2-hydroxypropyl ester of a hydroxybenzoic acid and an alkyl acrylate or methacrylate. Particularly preferred amongst such copolymers is a copolymer of 2-acrylamido-2-methyl-1-propanesulphonic acid, 3-methacryloyloxy-2-hydroxypropyl salicylate, methyl methacrylate and n-butyl acrylate.

Preferred cationic/anionic copolymers are those of a dialkylaminoalkyl acrylate or methacrylate with acrylic or methacrylic acid, a $C_1$ to $C_{12}$ alkyl or hydroxyalkyl acrylate or methacrylate and, optionally, one or more other vinyl monomers. Particularly preferred such copolymers are those of dimethylaminoethyl methacrylate with methacrylic acid, methyl methacrylate and 2-hydroxyethyl methacrylate.

As already indicated, the electrodepositable resin is present in the aqueous composition in at least partially ionised form. Acids suitable for addition to the resin to effect at least partial neutralisation thereof include organic acids such as acetic, propionic, lactic, maleic, p-toluenesulphonic and glycolic acids and inorganic acids such as hydrochloric and sulphuric acids. Bases suitable for addition to the resin to effect at least partial neutralisation thereof include organic bases such as triethylamine, triethanolamine, benzyldimethylamine, morpholine and 2-(dimethylamino)ethanol and inorganic bases such as sodium or potassium hydroxide or carbonate and ammonia. The resin is usually at least 5%, preferably 20 to 100%, neutralised. In especially preferred processes, the resin is completely neutralised.

Minor amounts, compared with the volume of water, of an organic solvent such as a ketone, alcohol, ether or ester may be included in the aqueous composition. Suitable organic solvents include acetone, methyl ethyl ketone, methyl isobutyl ketone, ethanol, isopropanol, 2-methoxyethanol, 2-ethoxyethanol, 2-n-butoxyethanol, diethylene glycol monobutyl ether, 2-methoxypropyl acetate, 2-ethoxyethyl acetate (oxitol acetate) and mixtures of two or more thereof. Photosensitisers such as Michler's ketone, benzoin ethers, benzil ketals and thioxanthones may also be incorporated in the aqueous composition.

The o-quinone diazide compound (A) and the electrodepositable resin (B) are generally used in amounts such that the aqueous composition contains, by weight, at least 0.05 part of (A) per part of (B). Where the quinone diazide (A) is itself resinous, it is conveniently present in an amount of 0.5 to 1.5 parts, preferably 0.75 to 1.25 parts, per part by weight of (B). When (A) is not resinous, it is conveniently present in an amount of 0.05 to 0.5 part, preferably 0.1 to 0.3 part, per part by weight of (B).

In preparing the aqueous composition, the quinone diazide (A) and the electrodepositable resin (B), together with any other optional ingredients, are usually dissolved in the organic solvent and the resulting mixture is diluted with water to give an aqueous composition suitable for use as an electrodeposition medium. The aqueous composition, which can be a solution but is usually a dispersion, generally has a solids content of 2 to 40%, preferably 5 to 20%, by weight.

Electrodeposition of the photosensitive film from the aqueous composition may be carried out using conventional electrodeposition procedures for resinous materials. Thus, the substrate on which the image is to be formed is immersed as an electrode in the aqueous composition, either as cathode or anode according to the nature of the electrodepositable resin and its partial neutralisation, another conductive material such as a metal sheet is immersed as the other electrode and an electric current is passed through the aqueous composition to deposit a photosensitive film of the required thickness on the substrate which is to have the image formed thereon. Voltages up to 200 volts for periods of up to 5 minutes are generally used, but the precise conditions for particular resins, substrates and desired thicknesses may be readily determined by those skilled in the art of electrodepositing resinous materials. After electrodeposition, the substrate bearing the photosensitive film is removed from the aqueous composition and is usually rinsed and then heated at a temperature up to 90° C. to dry the photosensitive film.

The substrate on which the photosensitive film is deposited may be of an electrically conductive plastics material, for example a thermoset resin containing electrically conductive particles distributed therein. Preferably, it is of a metal such as copper or aluminium, either as a solid metal sheet or as a metal-clad laminate which may have metal-lined through-holes or vias. Thus the process of the invention is useful in the production of printing plates and printed circuits.

Subjection of the electrodeposited film to radiation in a predetermined pattern may be achieved by exposure through a mask, i.e. an image-bearing transparency consisting of substantially opaque and substantially transparent areas, or by means of a computer-controlled laser beam. Electromagnetic radiation having a wavelength of 200-600 nm is generally used, and suitable sources include carbon arcs, mercury vapour arcs, fluorescent lamps with phosphors emitting ultra violet light, argon and xenon glow lamps, tungssten lamps, and photographic flood lamps; of these, mercury vapour arcs and metal halide lamps are the most suitable. The exposure time required depends on such factors as the nature of the quinone diazide and electrodepositable resin, the thickness of the electrodeposited film, the type of radiation source, and its distance from the film. Suitable exposure times can readily be found by routine experimentation.

After irradiation, areas of the film exposed to radiation are removed by treating the film with an aqueous base as developer. Suitable developers are aqueous solutions containing 0.5 to 5% by weight of sodium or potassium hydroxide or carbonate, which may contain small amounts of surfactant and water-miscible organic solvent to aid development.

The image obtained on development consists of areas of the surface of the substrate (which have been exposed by development) and areas of residual photosensitive film, corresponding to the areas not exposed in the imagewise irradiation, overlying the remainder of the substrate. When the surface of the substrate is metallic, the metal exposed by development may be etched, either to remove metal or to increase the depth of the image and hence increase its differentiation, the residual photosensitive film in the remaining (non-exposed) areas protecting the underlying substrate from attack. Such etching procedures, for example, using ferric chloride or ammonium persulphate solutions on copper substrates, are well known. The residual photosensitive film can then be removed by, for example, subjection to a further, non-imagewise, irradiation followed by treatment with an aqueous base. Alternatively, the residual film can be removed by treatment with a more powerful solvent than that used for image development, for example a more concentrated solution of the same base, or by treatment with the same solution as used for development but under more severe conditions, for instance with longer contact between the film and the solution. Suitable film-removing agents include aqueous solutions containing 1-10% by weight of sodium or potassium hydroxide or carbonate and organic solvents such as acetone, methyl ethyl ketone, 2-ethoxyethanol, 2-n-butoxyethanol, 2-ethoxyethyl acetate, toluene, or mixtures of two or more thereof. When the substrate is a metal-clad plastics laminate, removal of the residual film produces an image, in metal, on the plastics laminate.

The process of the invention is useful in the production of printed circuit boards with buried via holes, that is multilayer boards made using metal-clad plastics laminates having through hole-plated via holes which interconnect the conductive tracking on their two sides. When such laminates are used in the process of the invention, the electrodeposited photosensitive film is imagewise irradiated so that the parts of the film coating the via holes are not exposed to the radiation, for example by aligning the via holes with opaque areas of an image-bearing mask.

The invention is illustrated by the following Examples, in which all parts and percentages are by weight unless stated otherwise.

The resins used in the Examples are prepared as follows:

Resin I

A novolak (40 g), prepared from a commercial mixture of cresols (1 mol) and formaldehyde (0.75 mol), is dissolved in 2-n-butoxyethanol (80 g) and heated to 80° C. A solution containing diethanolamine (8.4 g), paraformaldehyde (5.28 g; 91% $(HCHO)_x$), lactic acid (11.52 g; 75%) and 2-n-butoxyethanol (10 g) is added and the mixture maintained at 80° C. for 3 hours. The mixture is diluted with water (200 g), cooled to room temperature and poured slowly into stirred 0.5N sodium hydroxide solution (1.8 liters) at 40° C. The buff coloured precipitate formed is filtered off, washed with water and dried in a vacuum oven at 45° C. to give 41.6 g of Resin I.

Resin II

A novolak (50 g), prepared from phenol (2.25 mols), p-tert.butyl phenol (0.75 mol) and formaldehyde (2.7 mols) is dissolved in 2-n-butoxyethanol and heated to 80° C. A solution containing diethanolamine (21 g), formalin (31 g; 38.83% HCHO) and 2-n-butoxyethanol (10 g) is added and the mixture maintained at 80° C. for 2 hours. Lactic acid (24 g; 75%) is added and the mixture reacted at 80° C. for 1 hour. The reaction mixture is then diluted with water (250 g), cooled to room temperature and poured slowly into stirred 0.12N sodium hydroxide solution (1660 ml). The resulting buff coloured precipitate is filtered off, washed with water and dried in a vacuum oven at 45° C. to give 65.6 g of Resin II.

Resin III

A novolak (40 g), prepared from phenol (2.25 mols), p-tert.butylphenol (0.75 mol) and formaldehyde (2.7 mols), is dissolved in 2-n-butoxyethanol (80 g) and heated to 80° C. A solution containing diethanolamine (8.4 g), paraformaldehyde (5.28 g; 91% $(HCHO)_x$,), lactic acid (11.52 g; 75%) and 2-n-butoxyethanol (10 g) is added and the mixture maintained at 80° C. for 3 hours. The reaction mixture is diluted with water (200 g), cooled to room temperature and poured slowly into stirred 0.05N sodium hydroxide solution (1.8 liters) at 40° C. The buff coloured precipitate which forms is filtered off, washed with water and dried in a vacuum oven at 45° C. to give 27 g of Resin III.

Resin IV

A novolak (150 g), prepared from phenol (2.25 mols), p-tert.butylphenol (0.75 mol) and formaldehyde (2.7 mols), is dissolved in 2-n-butoxyethanol (250 g) and heated to 80° C. A solution containing sarcosine (10.02 g), paraformaldehyde (7.4 g; 91%), aqueous 20% sodium hydroxide (22.5 g) and 2-n-butoxyethanol (25 g) is added and the mixture maintained at 80° C. for 3 hours. The reaction mixture is diluted with water (1,600 ml) containing aqueous 20% sodium hydroxide (18 g), cooled to room temperature and poured slowly into stirred 0.1N hydrochloric acid (4 liters). The resulting buff coloured precipitate is filtered off, washed with water and dried in a vacuum oven at 45° C. to give Resin IV.

Resin V

A novolak (100 g), prepared from phenol (2.25 mols), p-tert.butylphenol (0.75 mols) and formaldehyde (2.7 mols), is dissolved in 2-n-butoxyethanol (200 g) and heated to 80° C. A solution containing glycine (5.6 g), paraformaldehyde (5.0 g; 91%), aqueous 20% sodium hydroxide (15.0 g) and 2-n-butoxyethanol (20 g) is added and the mixture is maintained at 80° C. for 4 hours.

The reaction mixture is diluted with water (500 g) containing aqueous 20% sodium hydroxide (12 g), cooled to room temperature and poured slowly into stirred 0.04N hydrochloric acid (4 liters). The buff coloured precipitate obtained is filtered off, washed with water and dried in a vacuum oven at 45° C. to give 105 g of Resin V.

Resin VI

A novolak (60 g), prepared from a commercial mixture of cresols (1 mol) and formaldehyde (0.75 mol), is dissolved in 2-n-butoxyethanol (120 g) and heated to 80° C. A solution containing sarcosine (3.2 g), paraformaldehyde (2.38 g; 91%), aqueous 20% sodium hydroxide (7.2 g) and 2-n-butoxyethanol (10 g) is added and the mixture reacted for 5 hours at 80° C. The reaction mixture is diluted with water (300 g), cooled to room temperature and poured slowly into stirred 0.03N hydrochloric acid (2.7 liters). The buff coloured precipitate which forms is filtered off, washed with water and dried in a vacuum oven at 45° C., to give Resin VI.

Resin VII

Methyl methacrylate (50 g), methacrylic acid (10 g), 2-hydroxyethyl methacrylate (40 g), and tert.dodecylmercaptan (0.03 g) are heated to reflux temperature in tetrahydrofuran (350 g). Azobis(isobutyronitrile) (AIBN) (1.5 g) is added and the mixture maintained at the reflux temperature for 5 hours. The reaction mixture is then cooled to room temperature and poured slowly into stirred hexane (900 ml). The white precipitate formed is filtered off, washed with further hexane and dried in a vacuum oven at 45° C. to give 89 g of a copolymer having an acid value of 1.06 equivs/kg.

Resin VIII

Methyl methacrylate (15 g), methacrylic acid (3.8 g), 2-ethylhexyl methacrylate (15 g), 2-hydroxyethyl methacrylate (16.2 g) and tert.dodecyl mercaptan (0.015 g) are heated to reflux temperature in tetrahydrofuran (160 g). AIBN (0.75 g) is added and the mixture is maintained under reflux for 5 hours, cooled to room temperature and poured slowly into stirred hexane (450 ml). The white precipitate formed is filtered off, washed with hexane and dried in a vacuum oven at 45° C. to give 40 g of a copolymer having an acid value of 0.90 equiv./kg.

Resin IX

Methyl methacrylate (45 g), 2-hydroxyethyl methacrylate (40 g), methacrylic acid (10 g), dimethylaminoethyl methacrylate (5 g) and tert.dodecylmercaptan (0.03 g) are heated to reflux temperature in tetrahydrofuran (350 g). AIBN (1.5 g) is added and the mixture maintained under reflux for 5 hours. The reaction mixture is cooled to room temperature and added slowly to stirred hexane (900 ml). The resulting white precipitate is filtered off, washed with further hexane and dried in a vacuum oven at 45° C. to give 80 g of a copolymer having an amine value of 0.36 equiv/kg.

Resin X

A mixture of styrene (40 g), 2-ethylhexyl acrylate (32.5 g), 2-hydroxyethyl methacrylate (20 g), dimethylaminoethyl methacrylate (7.5 g) and AIBN (1.5 g) is added dropwise over 2 hours to stirred 2-n-butoxyethanol at 100° C. The reaction mixture is maintained at 100° C. for a further hour and a further charge of AIBN (0.5 g) and 2-n-butoxyethanol (5.5 g) is added. This procedure is repeated twice more and the reaction mixture is then maintained at 100° C. for a further hour before cooling. The resulting solution has an amine value of 0.28 equiv./kg.

Resin XI

This denotes a resin made by reacting a novolak prepared from 3 moles phenol, 1 mole of p-tert.butyl phenol, and formaldehyde with 1,2-naphthoquinone-2-diazide-5-sulphonyl chloride so as to esterify about 12% of the phenolic hydroxyl groups. The resin has an average molecular weight of about 1450.

Resin XII

A mixture of salicylic acid (138 g), dioxan (100 g), benzyldimethylamine (2.5 g) and hydroquinone (0.05 g) is heated to 100° C. To the resulting solution a mixture of glycidyl methacrylate (146.4 g) and dioxan (13.0 g) is added over 30 minutes at 100° C. The solution is maintained at 100° C. for 6 hours, when the acid value has fallen to 0.06 equiv./kg. The product is a 70% solution of 3-methacryloyloxy-2-hydroxypropyl salicylate. A mixture of this 70% solution (14.28 g), n-butyl acrylate (6.13 g), methyl methacrylate (7.15 g), 2-acrylamido-2-methyl-1-propane sulphonic acid (1.73 g) and AIBN (0.38 g) is added dropwise over 2 hours to stirred 2-n-butoxyethanol (20.7 g) at 100° C. The resulting mixture is maintained at 100° C. for a further hour and a further charge of AIBN (0.13 g) is added. The procedure of heating at 100° C. for 1 hour followed by addition of AIBN (0.13 g) is repeated twice more and the reaction mixture is maintained at 100° C. for a further hour before cooling. The resulting copolymer solution has an acid value of 0.14 equiv/kg.

EXAMPLE 1

Resin I (4.0 g) is added slowly, with stirring, to a mixture of 2-n-butoxyethanol (6.0 g), oxitol acetate (0.5 g) and 2,4-di(1,2-naphthoquinone-2-diazide-5-sulphonyloxy)benzophenone (0.5 g). The resulting mixture is neutralised with lactic acid and diluted with water to give a dispersion having a 10% solids content. A copper-clad laminate and a stainless steel sheet are immersed in the dispersion as cathode and anode respectively. An electric current is passed through the dispersion at 20 volts for 1 minute to deposit a resinous film on the laminate. The laminate is removed from the dispersion, rinsed in a mixture of water and butoxyethanol (volume ratio 9:1) and dried at 90° C. for 5 minutes, after which the electrodeposited film is a tack-free solid layer having a thickness of 7 micrometers. The dried film is irradiated through a mask for 30 seconds using a 5000 w metal halide lamp at a distance of 75 cm. Development of the irradiated film by immersion in aqueous 3% sodium hydroxide solution containing 0.01% of a non-ionic fluorocarbon surfactant (used as a 1% solution in 2-butoxyethanol) gives a clear positive image of the mask.

The copper exposed by development is removed by etching in an aqueous 40% solution of ferric chloride at 30° C., after which the laminate is washed, dried and irradiated again using the 5000 w lamp for 60 seconds without the mask. Immersion of the re-irradiated laminate in aqueous 3% sodium hydroxide completely removes the residual resin to give a clear image of the mask, in copper, on the laminate.

EXAMPLE 2

Resin I (4.0 g) is added slowly, with stirring, to a mixture of 2-n-butoxyethanol (5.0 g), and an ester of 1 mol of 2,3,4-trihydroxybenzophenone with 2.5 mols of 1,2-naphthoquinone-2-diazide-5-sulphonyl chloride (0.5 g). The resulting mixture is neutralised with lactic acid and diluted with water to give a dispersion having a 10% solids content. A resinous film is electrodeposited from the dispersion onto a copper-clad laminate as described in Example 1, but passing the current at 40 volts for 1 minute. The film is rinsed, dried (to give a thickness of 7 micrometers) and irradiated through a mask as described in Example 1, but irradiating for 1 minute. Development as described in Example 1 gives a clear positive image of the mask on the laminate.

EXAMPLE 3

Example 2 is repeated replacing Resin I with an equal amount of Resin II, passing the current at 20 volts for 1 minute, irradiating through the mask for 30 seconds and developing in an aqueous 1% sodium hydroxide solution containing 0.01% of the non-ionic fluorocarbon surfactant (used as a 1% solution in 2-butoxyethanol). A clear positive image of the mask is obtained on the copper-clad laminate.

The copper exposed on development is removed by etching as in Example 1 and the residual resin is completely removed by re-irradiation as described in Example 1 and immersion in aqueous 1% sodium hydroxide solution to give a clear image of the mask, in copper, on the laminate.

EXAMPLE 4

Example 3 is repeated, but using 1.0 g of the quinone diazide sulphonyl ester. A clear positive image of the mask is obtained on the copper-clad laminate.

EXAMPLE 5

Resin III (4.0 g) is added slowly to a mixture of 2-n-butoxyethanol (5.0 g), oxitol acetate (0.5 g), and 2,4-di(1,2-naphthoquinone-2-diazide-5-sulphonyloxy)benzophenone (0.5 g). The resulting mixture is neutralised with lactic acid and diluted with water to give a dispersion having a solids content of 10%. A resinous film is electrodeposited from the dispersion onto a copper-clad laminate, rinsed and dried as in Example 1, but passing the current at 15 volts for 1 minute and giving a dried film thickness of 5 micrometers. The dried film is irradiated through a mask and developed as described in Example 3 to give a clear positive image of the mask on the laminate.

EXAMPLE 6

Resin I (2.0 g) and Resin XI (2.0 g) are added slowly, with stirring, to 2-n-butoxyethanol (5.0 g). The resulting mixture is neutralised with lactic acid and diluted with water to give a dispersion having a solids content of 10%. A resinous film is electrodeposited from the dispersion onto a copper-clad laminate, rinsed and dried as in Example 1, but passing the current at 10 volts for 1 minute and giving a dried film thickness of 6 micrometers. The dried film is irradiated through a mask as described in Example 1 and developed by immersion in aqueous 2% sodium hydroxide solution containing 0.01% of a fluorocarbon non-ionic surfactant (used as a 1% solution in 2-n-butoxyethanol) to give a clear positive image of the mask on the laminate.

EXAMPLE 7

Resin III (2.0 g) and Resin XI (2.0 g) are added slowly, with stirring, to 2-n-butoxyethanol (5.0 g). The resulting mixture is neutralised with lactic acid and diluted with water to give a dispersion having a 10% solids content. A resinous film is electrodeposited from the dispersion onto a copper-clad laminate, rinsed and dried as described in Example 6, but giving a dried film thickness of 8 micrometers. The dried film is irradiated through a mask as described in Example 1 and then developed by immersion in the developer used in Example 3 to give a clear positive image of the mask on the laminate.

The copper exposed by development is removed by etching as described in Example 1. The residual resin is then removed by re-irradiation as described in Example 1 followed by immersion in aqueous 1% sodium hydroxide to give a clear image of the mask, in copper, on the laminate.

EXAMPLE 8

Example 7 is repeated, but using 2.5 g of Resin III and 1.5 g of Resin XI and developing by immersion in the developer used in Example 6. A clear positive image of the mask is obtained on the laminate.

EXAMPLE 9

Resin IV (4.0 g) is dissolved in a mixture of 2-n-butoxyethanol (4.0 g), oxitol acetate (0.5 g) and 2,4-di(1,2-naphthoquinone-2-diazide-5-sulphonyloxy)benzophenone (0.5 g). The resulting mixture is neutralised with aqueous 5% potassium hydroxide and diluted with water to give a dispersion having a 10% solids content. A copper-clad laminate and a stainless steel sheet are immersed in the dispersion as anode and cathode respectively. An electric current is passed through the dispersion at 40 volts for 1 minute to deposit a resinous film on the laminate. The laminate is removed from the dispersion, rinsed in a mixture of water and 2-n-butoxyethanol (volume ratio 9:1) and dried at 90° C. for 5 minutes, after which the electrodeposited film is a solid, tack-free layer having a thickness of 6 micrometers. The dried film is irradiated through a mask and developed as described in Example 3 to give a clear positive image of the mask on the laminate.

The copper exposed by development is removed by etching as in Example 1 and the residual resin is removed by re-irradiation as in Example 1 followed by immersion in aqueous 1% sodium hydroxide to give a clear image of the mask, in copper, on the laminate.

EXAMPLE 10

Resin V (4.0 g) is added slowly, with stirring, to a mixture of 2-n-butoxyethanol (4.5 g), oxitol acetate (0.5 g) and 2,4-di(1,2-naphthoquinone-2-diazide-5-sulphonyloxy)benzophenone (0.5 g). The resulting mixture is neutralised with aqueous 5% potassium hydroxide solution and diluted with water to give a dispersion having a 10% solids content. a resinous film is electrodeposited from the dispersion onto a copper-clad laminate, rinsed and dried as in Example 9, but passing the current at 50 volts for 1 minute. The dried film, 7 micrometers thick, is irradiated through a mask and developed as in Example 3 to give a clear positive image of the mask on the laminate. Etching of the exposed copper and removal of residual resin as described in Example 9 gives a clear image of the mask. in copper, on the laminate.

EXAMPLE 11

Example 10 is repeated using 1.0 g of oxitol acetate and 1.0 g of the quinone diazide sulphonyl ester, passing the current at 40 volts for 1 minute giving a dried film thickness of 9 micrometers and developing as in Example 6. A clear positive image of the mask is obtained on the laminate.

EXAMPLE 12

Example 10 is repeated, replacing the mixture used in that Example with a mixture of Resin VI (4.0 g), 2-n-butoxyethanol (4.0 g), oxitol acetate (0.5 g) and 2,4-di(1,2-naphthoquinone-2-diazide-5-sulphonyloxy)benzophenone (0.5 g), passing the current at 100 volts for 2 seconds giving a dried film thickness of 18 micrometers, and developing by immersion in the developer used in Example 1. A clear positive image of the mask is obtained on the laminate.

EXAMPLE 13

Resin IV (2.0 g) and Resin XI (2.0 g) are added slowly, with stirring, to 2-n-butoxyethanol (4.5 g). The mixture is neutralised with aqueous 5% potassium hydroxide and diluted with water to give a dispersion having a solids content of 10%. A resinous film is electrodeposited from the dispersion onto a copper-clad laminate, rinsed, dried, irradiated and developed as in Example 9, but passing the current at 25 volts for 1 minute to give a dried film thickness of 8 micrometers, to give a clear positive image of the mask on the laminate.

EXAMPLE 14

Example 13 is repeated, replacing Resin IV by Resin V (1.5 g), using 2.5 g of Resin XI and passing the current at 30 volts for 1 minute to give a dried film thickness of 7 micrometers. A clear positive image of the mask is obtained on the laminate.

EXAMPLE 15

Example 13 is repeated, replacing Resin IV by an equal amount of Resin VI, passing the current at 35 volts for 1 minute to give a dried film thickness of 7 micrometers and developing by immersion in the developer used in Example 6. A clear positive image of the mask is obtained on the laminate.

EXAMPLE 16

Example 14 is repeated, replacing Resin V by an equal amount of Resin VI and passing the current at 40 volts for 1 minute to give a dried film thickness of 8 micrometers. A clear positive image of the mask is obtained on the laminate.

The copper exposed by development is removed by etching as described in Example 1. The residual resin is removed by re-irradiation as described in Example 1 followed by immersion in aqueous 1% sodium hydroxide. A clear image of the mask, in copper, is obtained on the laminate.

EXAMPLE 17

Resin VII (4.0 g) is added slowly, with stirring, to a mixture of 2-n-butoxyethanol (5.0 g), oxitol acetate (1.0 g), and 2,4-di(1,2-naphthoquinone-2-diazide-5-sulphonyloxy)benzophenone (1.0 g). The resulting mixture is neutralised with aqueous 5% potassium hydroxide and diluted with water to give a dispersion having a 10% solids content. A copper-clad laminate and a stainless steel sheet are immersed in the dispersion as anode and cathode respectively. An electric current is passed through the dispersion at 10 volts for 1 minute to deposit a resinous film on the laminate. The laminate is removed from the dispersion, rinsed in a mixture of water and 2-n-butoxyethanol (volume ratio 9:1) and dried for 5 minutes at 90° C., after which the electrodeposited film is a tack-free solid layer having a thickness of 20 micrometers. The dried film is irradiated through a mask for 60 seconds using a 5000 w metal halide lamp at a distance of 75 cm. Development of the irradiated film by immersion in aqueous 3% sodium hydroxide solution containing 0.01% of a non-ionic fluorocarbon surfactant (used as a 1% solution in 2-n-butoxyethanol) gives a clear positive image of the mask.

EXAMPLE 18

Example 17 is repeated, replacing Resin VII by an equal amount of Resin VIII, passing the current at 20 volts for 3 seconds to give a dried film thickness of 10 micrometers and developing by immersion in the developer used in Example 6. A clear positive image of the mask is obtained on the laminate.

The copper exposed by development is removed by etching as in Example 1. The residual resin is then removed by re-irradiation as described in Example 1 followed by immersion in aqueous 2% sodium hydroxide to give a clear image of the mask, in copper, on the laminate.

EXAMPLE 19

Resin VII (1.5 g) and Resin XI (2.5 g) are added slowly, with stirring, to 2-n-butoxyethanol (5.0 g). The resulting mixture is neutralised with aqueous 5% potassium hydroxide and diluted with water to give a dispersion having a 10% solids content. A resinous film is electrodeposited from the dispersion onto a copper-clad laminate, rinsed, dried, irradiated and developed as in Example 3, but using the laminate as anode and the steel sheet as cathode, the thickness of the dried electrodeposited film being 10 micrometers. A clear positive image of the mask is obtained on the laminate. The copper exposed by development is removed by etching as in Example 1 and the residual resin is removed by the procedure described in Example 3 to give a clear image of the mask, in copper, on the laminate.

EXAMPLE 20

Example 19 is repeated, replacing Resin VII by Resin VIII (2.0 g), using 2.0 g of Resin XI, passing the current at 60 volts for 1 minute to give a dried film thickness of 8 micrometers, and developing as in Example 1. A clear positive image of the mask is obtained on the laminate. Etching and removal of residual resin as described in Example 1 gives a clear image of the mask, in copper, on the laminate.

EXAMPLE 21

Resin IX (4.0 g) is added slowly, with stirring, to a mixture of 2-n-butoxyethanol (5.0 g), oxitol acetate (5.0 g) and 2,4-di(1,2-naphthoquinone-2-diazide-5-sulphonyloxy)benzophenone (0.5 g). The resulting mixture is neutralised with lactic acid and diluted with water to give a dispersion having a 10% solids content. A copper-clad laminate and a stainless steel sheet are immersed in the dispersion as cathode and anode respectively. An electric current is passed through the dispersion at 10 volts for 1 minute to deposit a resinous film on the laminate. The laminate is removed from the dispersion, rinsed in a mixture of water and 2-n-butoxyethanol (volume ratio 9:1) and dried for 5 minutes at 90° C., after which the electrodeposited film is a tack-free solid layer having a thickness of 13 micrometers. The dried film is irradiated through a mask for 30 seconds, using a 5000 w metal halide lamp at a distance of 75 cm. Immersion in aqueous 0.5% sodium hydroxide containing 0.01% of a non-ionic fluorocarbon surfactant (used as a 1% solution in 2-n-butoxyethanol) gives a clear positive image of the mask on the laminate.

EXAMPLE 22

Resin IX (2.0 g) and Resin XI (2.0 g) are added slowly, with stirring, to 2-n-butoxyethanol (5.0 g). The mixture is neutralised with lactic acid and diluted with water to give a dispersion having a 10% solids content. A resinous film is electrodeposited from the dispersion onto a copper-clad laminate, rinsed, dried, irradiated (but for 1 minute) and developed as in Example 3, the thickness of the dried electrodeposited film being 12 micrometers. A clear positive image of the mask is obtained on the laminate.

The copper exposed on development is removed by etching as in Example 1 and the residual resin is removed by the procedure described in Example 3 to give a clear image of the mask, in copper, on the laminate.

EXAMPLE 23

Example 22 is repeated, replacing the mixture used in that Example by a mixture of Resin X (3.33 g), Resin XI (2.0 g) and 2-n-butoxyethanol (3.17 g), passing the current at 10 volts for 1 minute to give a dried film thickness of 12 micrometers and developing as in Example 1. A clear image of the mask is obtained on the laminate.

The copper exposed by development and the residual resin are removed by the procedure described in Example 1 to give a clear image of the mask, in copper, on the laminate.

EXAMPLE 24

Example 17 is repeated, replacing the mixture used in that Example by a mixture of Resin XII (8 g), 2,4-di(1,2-naphthoquinone-2-diazide-5-sulphonyloxy)benzophenone (1 g) and oxitol acetate (1 g), 70% neutralising the mixture with 5% potassium hydroxide (0.88 g), passing the current at 50 volts for 1 minute to give a dried film thickness of 10 micrometers and irradiating through the mask for 30 seconds. Development as in Example 17 gives a clear positive image of the mask.

What is claimed is:

1. A process for the formation of an image which comprises (i) electrodepositing on a conductive surface a photosensitive film from an aqueous composition which is a solution or dispersion comprising a mixture of (A) a photosensitive o-quinone diazide compound and (B) an electrodepositable film-forming resin having an amino group or a carboxylic, sulfonic or phosphonic acid group, which is present in at least partially ionized form, in (C) an aqueous medium, said composition containing at least 0.05 part of (A) per part by weight of (B), having a solids content of 2 to 40% and being substantially free from a resin having both a quinone diazide residue and a carboxyl, phosphonic or sulfonic acid or amino group in the same molecule, (ii) subjecting the electrodeposited film on the conductive surface to radiation in a predetermined pattern, such that areas of the film exposed to radiation become more soluble in aqueous base than unexposed areas of the film, and (iii) removing the exposed areas by treatment with an aqueous base, leaving the unexposed areas of the film on the conductive surface.

2. A process according to claim 1, in which (A) is an o-benzoquinone diazide sulfonyl or o-naphthoquinone diazide sulfonyl ester of a phenol.

3. A process according to claim 1 wherein (A) is 2,4-di(1,2-naphthoquinone-2-diazide-5-sulfonyloxy)benzophenone.

4. A process according to claim 1, in which (B) is a resin having an amino, carboxyl or sulfonic acid group which is present in the aqueous composition in at least partially ionized form.

5. A process according to claim 4, in which (B) is a cationic or cationic/anionic phenolic resin which is
- a reaction product of a novolak resin, an aldehyde and a primary or secondary amine or an aminocarboxylic acid; or a cationic copolymer of two or more vinyl monomers, at least one of said monomers being a dialkylaminoalkyl acrylate or methacrylate and at least one of said monomers being an alkyl or hydroxyalkyl acrylate or methacrylate; or an anionic copolymer of two or more vinyl monomers, at least one of said monomers being acrylic or methacrylic acid and at least one of said monomers being an alkyl or hydroxyalkyl acrylate or methacrylate;

an anionic copolymer of two or more vinyl monomers, at least one of said monomers being a vinyl group-containing sulfonic acid and at least one of said monomers being an acrylate or methacrylate ester; or a cationic/anionic copolymer of three or more vinyl monomers, at least one of said monomers being a dialkylaminoalkyl acrylate or methacrylate, at least one of said monomers being acrylic acid or methacrylic acid and at least one of said monomers being an alkyl or hydroxyalkyl acrylate or methacrylate.

6. A process according to claim 4, in which (B) is a reaction product of (a) a novolak resin derived from phenol or an alkyl-substituted phenol, or a mixture of two or more thereof, and formaldehyde, acetaldehyde or benzaldehyde, (b) formaldehyde, acetaldehyde or benzaldehyde, and (c) an alkanolamine or an aminocarboxylic acid; or (B) is a copolymer of two or more vinyl monomers, at least one of said monomers being dimethylaminoethyl acrylate or methacrylate and at least one of said monomers being a $C_1$-$C_{12}$ alkyl or hydroxyalkyl acrylate or methacrylate; or a copolymer of two or more vinyl monomers, at least one of said monomers being acrylic acid or methacrylic acid and at least one of said monomers being a $C_1$-$C_{12}$ alkyl or hydroxyalkyl acrylate or methacrylate; or a copolymer of three or more vinyl monomers, at least one of said monomers being an acrylamide containing a sulfonic acid group, at least one of said monomers being an alkyl acrylate or methacrylate and at least one of said monomers being a 3-acryloyloxy-2-hydroxypropyl or 3-methacryloyloxy-2-hydroxypropyl ester of a hydroxybenzoic acid; or a copolymer of three or more vinyl monomers, at least one of said monomers being a dialkylaminoalkyl acrylate or methacrylate, at least one of said monomers being acrylic or methacrylic acid, and at least one of said monomers being a $C_1$ to $C_{12}$ alkyl or hydroxyalkyl acrylate or methacrylate.

7. A process according to claim 5, in which (B) is a reaction product of (a) a novolak resin derived from formaldehyde and either a mixture of o-, m- and p-cresols or a mixture of phenol and p-tert.butylphenol, (b) formaldehyde and (c) diethanolamine, sarcosine or glycine; or a copolymer of dimethylaminoethyl methacrylate with 2-ethylhexyl acrylate, 2-hydroxyethyl methacrylate and styrene; or a copolymer of methacrylic acid with methyl methacrylate and 2-hydroxyethyl methacrylate or a copolymer of methacrylic acid with methyl methacrylate, 2-ethylhexyl methacrylate and 2-hydroxyethyl methacrylate; or a copolymer of 2-acrylamido-2-methyl-1-propanesulfonic acid, 3-methacryloyloxy-2-hydroxypropyl salicylate, methyl methacrylate and n-butyl acrylate; or a copolymer of dimethylaminoethyl methacrylate with acrylic acid, methyl methacrylate and 2-hydroxyethyl methacrylate.

8. A process according to claim 1, in which a minor amount, compared with the amount of water, of an organic solvent is included in the aqueous composition.

9. A process according to claim 1, in which (A) is resinous and is present in an amount of 0.5 to 1.5 parts per part by weight of (B); or (A) is non-resinous and is present in an amount of 0.05 to 0.5 part per part by weight of (B).

10. A process according to claim 1, in which the aqueous composition has a solids content of 5 to 20% by weight.

11. A process according to claim 1, in which the electrodeposition stage (i) is carried out by immersing the substrate on which the image is to be formed as an electrode in the aqueous composition, immersing a conductive material as another electrode and passing an electric current through the aqueous composition to deposit a photosensitive film of the required thickness on the substrate.

12. A process according to claim 1, in which the conductive surface is metallic and metal exposed by the development stage (iii) is etched, either to remove the metal or to increase the depth of image, and residual photosensitive film is then removed.

13. A process according to claim 12, in which the residual photosensitive film is removed by subjection to a further, non-imagewise, irradiation followed by treatment with an aqueous base.

* * * * *